(12) United States Patent
    Walsh

(10) Patent No.: US 8,882,285 B2
(45) Date of Patent: Nov. 11, 2014

(54) ILLUMINATING SAFETY GLOVE

(76) Inventor: Desmond Walsh, Scud Hill (GI)

( * ) Notice: Subject to any disclaimer, the term of this patent is extended or adjusted under 35 U.S.C. 154(b) by 90 days.

(21) Appl. No.: 13/352,684

(22) Filed: Jan. 18, 2012

(65) Prior Publication Data

US 2012/0182720 A1 Jul. 19, 2012

Related U.S. Application Data

(60) Provisional application No. 61/433,687, filed on Jan. 18, 2011.

(51) Int. Cl.
*F21V 21/08* (2006.01)

(52) U.S. Cl.
USPC ............................................. 362/103

(58) Field of Classification Search
USPC .................................... 362/103–105
See application file for complete search history.

(56) References Cited

U.S. PATENT DOCUMENTS

| | | | | |
|---|---|---|---|---|
| 5,580,154 | A * | 12/1996 | Coulter et al. | 362/103 |
| 5,817,365 | A | 10/1998 | Richardson et al. | |
| 2008/0155726 | A1 * | 7/2008 | Anclien | 2/16 |
| 2009/0297756 | A1 | 12/2009 | Dehn | |
| 2011/0062134 | A1 | 3/2011 | Lochtman et al. | |
| 2011/0234414 | A1 * | 9/2011 | Ojeda et al. | 340/635 |

FOREIGN PATENT DOCUMENTS

| | | |
|---|---|---|
| DE | 19619858 A1 | 11/1997 |
| DE | 102011104868 A1 | 12/2012 |
| EP | 0840132 A2 | 5/1998 |
| WO | WO-2009/002569 A1 | 12/2008 |

OTHER PUBLICATIONS

Spanish Application Serial No. 201330053, Search Report dated Sep. 20, 2013, 4 pgs.

* cited by examiner

*Primary Examiner* — Evan Dzierzynski
(74) *Attorney, Agent, or Firm* — Schwegman Lundberg & Woessner, P.A.

(57) ABSTRACT

The present invention is a PVC or rubber illuminating safety glove utilized without a power source that includes a plurality of finger and thumb sections that accommodate a user's fingers and thumb and include a plurality of distal ends and a plurality of fingertips that are located on the distal ends of the finger and thumb sections and include a chemical compound that is safely embedded into the distal ends that become illuminated when exposed to an electromagnetic field. The embedded chemical compound is a plurality of microscopic polymer beads or a plurality of supermagnetic iron oxide nanoparticles that illuminate color instantly and reversibly when exposed to the electromagnetic field.

20 Claims, 1 Drawing Sheet

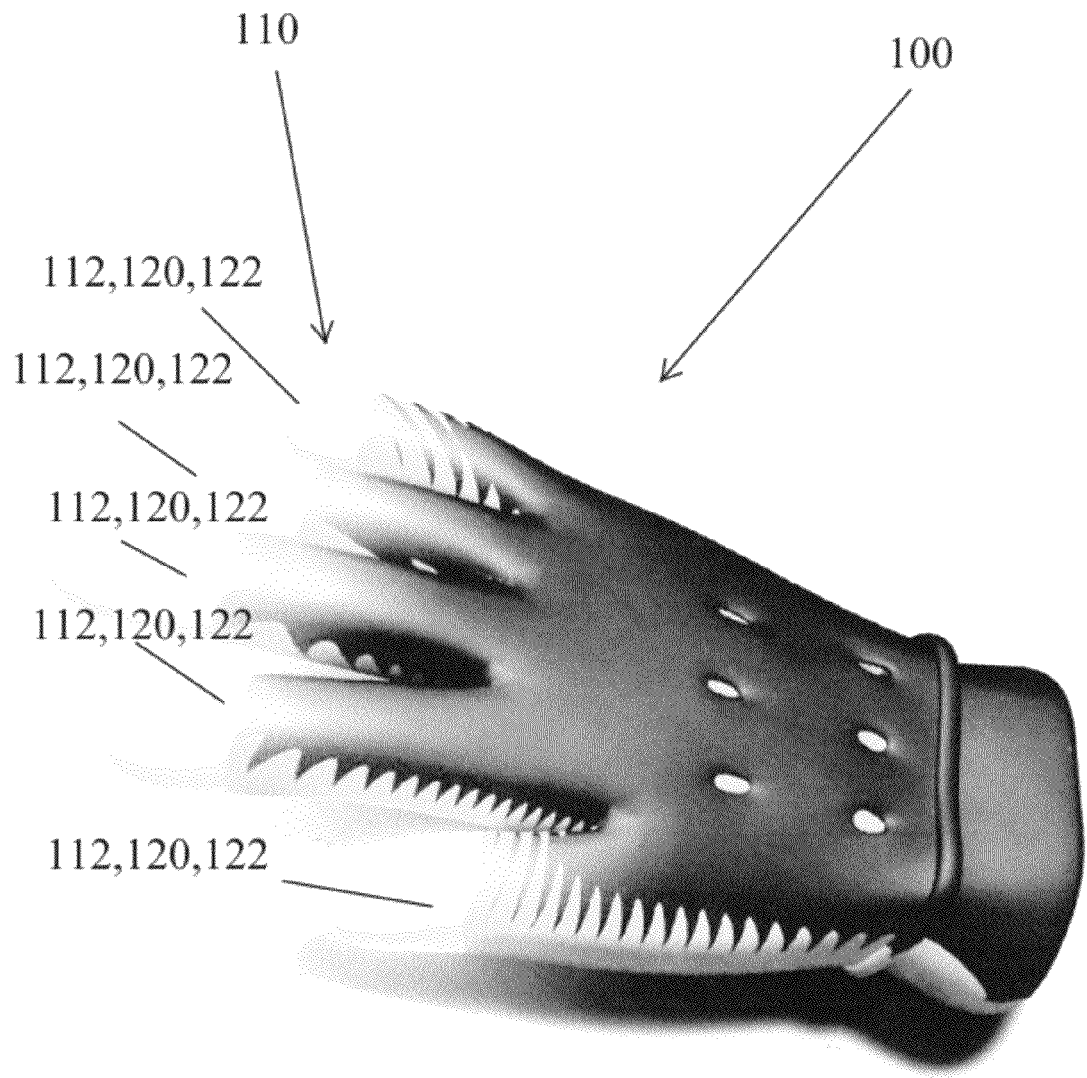

ILLUMINATING SAFETY GLOVE

This application claims priority to U.S. Provisional Application 61/433,687 filed on Jan. 18, 2011, the entire disclosure of which is incorporated by reference.

TECHNICAL FIELD & BACKGROUND

Conventional battery-operated proximity testers with audio and visual indicators are traditionally utilized to determine the presence and location of electromagnetic fields associated with an electrical conductor such as when an electrical current is flowing through an electrical cable.

The present invention generally relates to a safety glove. More specifically, the invention is an illuminating safety glove that changes color when exposed to an external magnetic field.

It is an object of the invention to provide an illuminating safety glove that provides a safe, quick and easy identification of an electrical conductor based on an embedded chemical compound that reacts to a surrounding magnetic field.

It is an object of the invention to provide an illuminating safety glove that serves as a convenient, effective alternative to conventional proximity testers.

It is an object of the invention to provide an illuminating safety glove that protects a user from an electrical shock.

What is really needed is an illuminating safety glove that provides a safe, quick and easy identification of an electrical conductor based on an embedded chemical compound that reacts to a surrounding magnetic field that protects a user from an electrical shock that protects a user from an electrical shock.

BRIEF DESCRIPTION OF THE DRAWINGS

The present invention will be described by way of exemplary embodiments, but not limitations, illustrated in the accompanying drawing in which like references denote similar elements, and in which:

FIG. 1 illustrates a top perspective view of an illuminating safety glove, in accordance with one embodiment of the present invention.

DETAILED DESCRIPTION OF ILLUSTRATIVE EMBODIMENTS

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention. However, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

FIG. 1 illustrates a top perspective view of an illuminating safety glove 100, in accordance with one embodiment of the present invention.

The illuminating safety glove 100 includes a plurality of finger and thumb sections 110 and a plurality of fingertips 120. The illuminating safety glove 100 is made of rubber or PVC material and serves as an insulator to protect a user from an electrical shock, although the illuminating safety glove 100 can be made of other suitable material as well. The illuminating safety glove 100 can be a left-handed glove, a right-handed glove or an ambidextrous glove. The illuminating safety glove 100 is utilized without any batteries or power source, which eliminates false readings and the need for audible alarms and problems associated with existing battery-operated detection equipment. The illuminating safety glove 100 is made of durable, flexible and breathable rubber or PVC material that allow secure, manageable comfort during use and that come in a variety of sizes, colors and aesthetic styles that can accommodate a professional electrician, do-it-yourselfer or other suitable user. The finger and thumb sections 110 accommodate a user's 4 fingers and thumb and include a plurality of distal ends 112. The fingertips 120 are located on the distal ends 112 of the finger and thumb sections 110. The fingertips 120 include a chemical compound 122 that is safely embedded into the distal ends 112 that is illuminated when exposed to an electromagnetic field within approximately 1 to 2 cm of the fingertips 120. The chemical compound 122 can also be disposed on other suitable portions of the illuminating safety glove 100. The chemical compound 122 can detect an electromagnetic field from an electrical current flowing through a live cable or wire or an electrically charged electric panel, piece of electrical equipment, electrical appliance or other suitable electromagnetic field source. The illuminating safety glove 100 is treated with a chemical bath or other suitable chemical treatment process to embed the chemical compound 122 within the distal ends 112. The chemical compound 122 is typically a plurality of microscopic polymer beads that change color instantly and reversibly when exposed to an electromagnetic field or a plurality of supermagnetic iron oxide nanoparticles that also change color instantly and reversibly when exposed to an electromagnetic field, although other suitable chemical compounds can be embedded into the distal ends 112 of the illuminating safety glove 100. The supermagnetic iron oxide nanoparticles are arranged in a specified orientation to generate any illumination or color.

Use of the illuminating safety glove 100 is straightforward. The illuminating safety glove 100 slips onto a user's hand in a similarly fashion to any other glove. A user would ensure the illuminating safety glove 100 is placed on their hand comfortably and securely. The user would then approach an electrically charged electric panel, piece of electrical equipment, electrical appliance or other suitable electromagnetic field source. When the illuminating safety glove 100 is within an electromagnetic field, the gloves will begin to illuminate indicating to a user that they are approaching an electrically charged electric panel, piece of electrical equipment, electrical appliance or other suitable electromagnetic field source.

While the present invention has been related in terms of the foregoing embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

The invention claimed is:

1. An illuminating safety glove, comprising:
   a plurality of finger and thumb sections that accommodate a user's fingers and thumb and include a plurality of distal ends; and
   a plurality of fingertips that are located on said distal ends of said finger and thumb sections and include a chemical compound that is safely embedded into said distal ends that become illuminated when exposed to an electromagnetic field from an electrical current.

2. The glove according to claim 1, wherein said chemical compound detects said electromagnetic field from an electrical current flowing through a live cable or a live wire.

3. The glove according to claim 1, wherein said illuminating safety glove is treated with a chemical bath to embed said chemical compound within said distal ends.

4. The glove according to claim 1, wherein said chemical compound is a plurality of microscopic polymer beads that change color instantly and reversibly when exposed to said electromagnetic field that reflect a plurality of spherical iron oxide nanoparticles.

5. The glove according to claim 1, wherein said illuminating safety glove is made of rubber material.

6. The glove according to claim 1, wherein said illuminating safety glove is made of PVC material.

7. The glove according to claim 1, wherein said illuminating safety glove is a left-handed glove.

8. The glove according to claim 1, wherein said illuminating safety glove is a right-handed glove.

9. The glove according to claim 1, wherein said illuminating safety glove is an ambidextrous glove.

10. The glove according to claim 1, wherein said illuminating safety glove is utilized without a power source.

11. A PVC or rubber illuminating safety glove utilized without a power source, comprising:
    a plurality of finger and thumb sections that accommodate a user's fingers and thumb and include a plurality of distal ends; and
    a plurality of fingertips that are located on said distal ends of said finger and thumb sections and include a chemical compound that is safely embedded into said distal ends that become illuminated when exposed to an electromagnetic field.

12. The glove according to claim 11, wherein said chemical compound detects said electromagnetic field from an electrical current flowing through a live cable or a live wire.

13. The glove according to claim 11, wherein said chemical compound detects said electromagnetic field from an electrically charged electric panel, a piece of electrical equipment or an electrical appliance.

14. The glove according to claim 11, wherein said illuminating safety glove is treated with a chemical bath to embed said chemical compound within said distal ends.

15. The glove according to claim 11, wherein said chemical compound is a plurality of microscopic polymer beads that change color instantly and reversibly when exposed to said electromagnetic field.

16. The glove according to claim 11, wherein said chemical compound is a plurality of supermagnetic iron oxide nanoparticles that change color instantly and reversibly when exposed to said electromagnetic field.

17. The glove according to claim 11, wherein said chemical compound becomes illuminated when within approximately 1 to 2 cm of said electromagnetic field.

18. The glove according to claim 11, wherein said illuminating safety glove is a left-handed glove.

19. The glove according to claim 11, wherein said illuminating safety glove is a right-handed glove.

20. The glove according to claim 11, wherein said illuminating safety glove is an ambidextrous glove.

* * * * *